United States Patent [19]

Labedz

[11] 4,302,817
[45] Nov. 24, 1981

[54] DIGITAL PSEUDO CONTINUOUS TONE DETECTOR

[75] Inventor: Gerald P. Labedz, Chicago, Ill.

[73] Assignee: Motorola, Inc., Schaumburg, Ill.

[21] Appl. No.: 121,563

[22] Filed: Feb. 14, 1980

[51] Int. Cl.³ .................................................. G06F 15/31
[52] U.S. Cl. .................................................. 364/724
[58] Field of Search ............... 364/724, 728; 455/35, 455/218; 328/138, 167

[56] References Cited

U.S. PATENT DOCUMENTS

| | | | |
|---|---|---|---|
| Re. 29,460 | 10/1977 | Mills ................................... | 364/724 |
| 3,131,354 | 4/1964 | Battin .................................. | 455/35 |
| 3,602,820 | 8/1971 | Kaufman ........................... | 455/218 |
| 3,748,451 | 7/1973 | Ingwersen ........................ | 364/728 |
| 3,950,635 | 4/1976 | Constant ............................ | 364/724 |
| 3,962,645 | 6/1976 | Stewart ............................... | 455/35 |
| 4,021,653 | 5/1977 | Sharp et al. ........................ | 364/724 |
| 4,127,824 | 11/1978 | Bennett, Jr. ...................... | 328/138 |
| 4,164,036 | 8/1979 | Wax .................................. | 364/728 X |
| 4,185,172 | 1/1980 | Melindo et al. ................. | 364/728 X |
| 4,216,463 | 8/1980 | Backof, Jr. et al. ............. | 364/724 X |

*Primary Examiner*—David H. Malzahn
*Attorney, Agent, or Firm*—James A. Scheer; James W. Gillman

[57] ABSTRACT

Method and apparatus for sampling input signals of different frequencies and providing a detect signal when the input frequency has a predetermined value suitable for use as a tone decoder for continuous tone controlled squelch systems. The method utilizes digital pseudo continuous correlation tone detection, and includes sample matrix limiting to provide rapid reverse burst turnoff, as well as background detection to avoid adjacent channel reverse burst turnoff falsing.

8 Claims, 10 Drawing Figures

DIGITAL PSEUDO CONTINUOUS TONE DETECTOR

BACKGROUND OF THE INVENTION

I. Field of the Invention

This invention relates generally to the electronic signal processing art and, in particular, to an improved digital tone detection method suitable for tone control squelch systems.

II. Description of the Prior Art

As a result of the extensive use of radio communications channels presently available, it has become common, especially in heavily populated metropolitan areas, to have several communication systems simultaneously operating on a common radio channel. Operators whose radios are not equipped with some form of tone squelch must listen to all conversations on the channel from transmitters that are within range. This is both annoying and fatiguing for the operators. The use of tone squelch to alleviate the annoyance is a common solution to the problem. A standard for subaudible continuous tone control squelch systems (CTCSS) is covered in an Electronic Industries Association (EIA) Standard RS 220-A, published in March of 1979.

Basically, such systems operate by equipping each radio transmitter in the particular radio system with a tone encoder operating on one of the 33 standard EIA channels between 67.0 and 250.3 HZ. When the transmitter is keyed, the operator's voice modulates the transmitter in the 300-3000 HZ range and simultaneously with the voice, the subaudible tone modulates the transmitter as well.

Receivers within the radio system are equipped with a frequency selective device (tone decoder) tuned to the same tone frequency as the tone encoder within the transmitters of the system. This tone decoder normally holds the receiver in the squelched mode. If a received signal is not modulated with the tone or is modulated with a tone that is not on the decoder frequency, then the receiver will remain squelched and the operator will not hear the interference. If a transmission is received having a tone corresponding to the frequency of the tone decoder, the receiver will be unsquelched and the operator will receive the message.

Numerous other applications are possible using subaudible tone, such as, control of radio repeaters, identifying a particular vehicle out of a plurality of vehicles, alarm and control signal applications, switching radio receiver or transmitter frequencies, switching communication circuits, etc.

Many of the tone squelch systems now being manufactured employ vibrating mechanical resonant reeds. Resonant reed systems suffer from a number of problems. In order to reprogram such a system the resonant reed must be replaced by a reed of another frequency. Long lead times are involved as service organizations rarely stock the 33 types of encoding and decoding reeds required for this type of change. In addition, vibrating mechanical resonant reeds suffer from short life and false operation when subject to vibration encountered in vehicular two-way radio service.

Until very recently it was difficult to employ electronic means for generating and decoding these low tone frequencies. One related approach to tone detection is referred to as a quadrature correlation detector for a signal of unknown input phase. This prior art electronic approach suffers from lack of flexibility in that it must be designed for a single frequency in a predetermined bandwidth. It is also difficult to integrate a circuit of this type with other circuits of a using system.

Thus, it is desirable to provide an electronic tone detector which can meet EIA standards and which is easily programmable. In addition, it is desirable that such a system be easily integrated with other circuits in a radio system and which minimizes sensitivity to vibration in mobile units and to noise in noisy transmission environments.

Solutions for these and other problems are provided for by the instant invention which is a digital pseudo continuous correlation tone detector. The frequency of the tone to be detected is programmable and can be specified with sufficient accuracy to meet EIA standards for subaudible continuous tone controlled squelch systems. Related subject matter is disclosed in a patent to Backof et al., U.S. Pat. No. 4,216,463.

SUMMARY OF THE INVENTION

It is an object of the invention to provide a method and apparatus for digital pseudo continuous correlation tone detection suitable for use with subaudible continuous tone controlled squelch systems.

It is another object of the invention to provide a method and apparatus for digital pseudo continuous correlation tone detection which is programmable.

Briefly, according to one embodiment of the invention, there is provided a method of processing an input signal to detect at least one desired tone of a plurality of tones. The input signal is first digitized, preferably using hard limiting, to generate samples of the input signal. Each sample is assigned to a phase subregion of a reference waveform where the reference waveform preferably has the frequency of the desired tone. The sample values for each phase subregion are then summed over sequential time intervals. As a result, for each time interval there is a subtotal for each phase subregion. Using the phase subregion subtotals from a number of the latest time intervals, the subtotals are correlated against at least one local reference waveform so as to obtain a total correlation value for each local reference waveform used. The total correlation value for each local reference waveform is the total summation of the products of the sum over a number of the latest time intervals of the subtotals of each phase subregion multiplied by the amplitude of a corresponding phase subregion of the local reference. The total correlation values are processed at the end of each time interval to obtain a sum of the absolute values of the total correlation values. This sum of the absolute values of the total correlation values is compared at the end of each time interval to a first threshold and a detection indication signal is generated in response to the sum exceeding the first threshold.

According to another feature of the invention, the first threshold is changed to a second threshold in response to the initial generation of the detection indication signal. In addition, if the second threshold is being used and the sum of the absolute values of the total correlation values falls below the second threshold at the end of any time interval, then a detection indication signal will not be generated and the first threshold will again be used.

According to another feature of the invention, any undesired tones on adjacent tone channels are detected.

If an undesired tone is present a background detection indication signal is generated. The background detection signal is used to generate an inhibit signal representative of the probability that an undesired tone has been present over a period of time prior to the sum of the absolute value of the total correlation value exceeding the first threshold. The detection indication signal is then inhibited in response to the inhibit signal.

According to still another feature of the invention, the sum of the absolute values of the total correlation values is compared to a third threshold at the end of each time interval and in response to the detection indication signal. A reverse burst signal is generated if the sum of the absolute value of the total correlation values exceeds the third threshold. In response to the reverse burst signal the first number of time intervals used in correlating is reduced, and the desired tone frequency is reprogrammed upward a predetermined amount. In addition, at the end of each time interval in which the reduced number of time intervals is used for correlating, the sum of the absolute values of the total correlation values is compared to a fourth threshold. In response to the sum of the absolute values of the total correlation values falling below the fourth threshold a control signal is generated and the number of time intervals used in correlating is increased to the first number of time intervals in response to the generation of the control signal.

BRIEF DESCRIPTION OF THE DRAWINGS

The features of the present invention which are believed to be novel are set forth with particularity in the appended claims. The invention, together with further objects and advantages thereof, may best be understood by reference to the following description when taken in conjunction with the accompanying drawings.

DESCRIPTION OF THE PREFERRED EMBODIMENT

Figure 1:
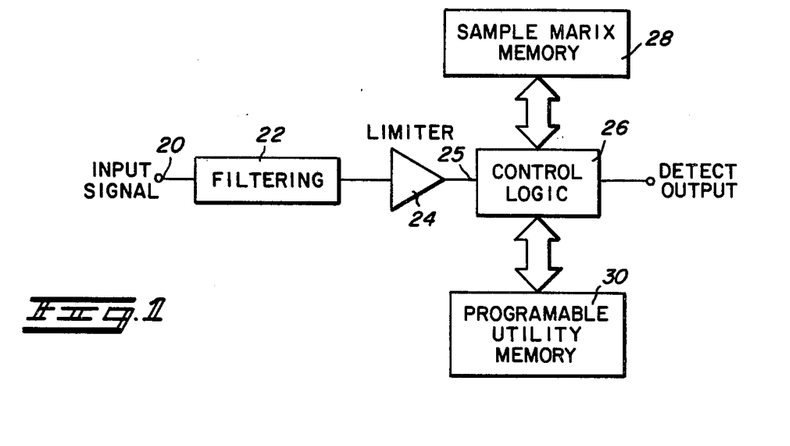
FIG. 1 is a generalized block diagram illustrating one embodiment of the inventive digital pseudo continuous correlation tone detector.

FIG. 1 is a generalized block diagram illustrating the fundamental blocks of the preferred embodiment of the invention intended for use as a detector for a continuous tone controlled squelch system. Here, a signal is applied to an input terminal 20 and coupled to a filter 22. The filter 22 is optional, but its use will improve the performance of the system for most applications. When used, it is preferably a low pass or band pass filter. The signal from the filter 22 is applied to a limiter 24 which hard limits the signal thus converting the signal into essentially a rectangular waveform.

The rectangular waveform from the limiter 24 is applied to the input 25 of the control logic 26. The control logic 26 samples the applied signal at a fixed rate $f_s$ and processes the samples to determine whether a tone of a predetermined desired frequency $f_o$ is present. Several processing parameters used by the control logic 26 are stored in a programmable utility memory 30 coupled to the control logic 26. In addition, in processing the samples the control logic 26 stores sample data in the sample matrix memory 28.

The processing of the data to permit a tone present/absent decision initially requires that the incoming limited signal applied to the control logic input 25 be sampled at a fixed rate $f_s$. The rate of the sampling must be high enough to permit adequate sampling of the highest frequency tone to be detected. In the preferred embodiment the highest frequency tone to be detected is approximately 250 HZ and the sampling rate is approximately 1,000 HZ. As the control logic 26 samples the rectangular signal, a high value is determined to be $+1$ and a low value is determined to be a $-1$ (other values can be used such as $+1$ and 0). Thus, the input signal is digitized by the combined function of hard limiting and sampling. This digitizing could also be accomplished by means of an A/D converter.

The digitized sample values are then assigned to a phase subregion (in the preferred embodiment there are four phase subregions and therefore they are phase quadrants) of a local reference waveform which preferably has the same frequency $f_o$ as that of the tone to be detected. This is accomplished by means of a phase accumulator which is incremented before each sample by a phase increment equal to $f_o/f_s$ stored in the programmable utility memory 30. The phase accumulator is then used to address one of four memory locations $M_1$, $M_2$, $M_3$ and $M_4$, corresponding to the four phase quadrants. Each sample value (either $+1$ or $-1$) is then added to the contents of the memory location addressed for that sample.

For example, assuming a sample rate $f_s=1,000$ HZ and a local reference waveform frequency (also the desired tone frequency) of $f_o=125$ HZ, the phase increment would be 0.125. As a result, if phase accumulator is started at zero, the first two sample values would be added to memory location $M_1$, the next two to memory location $M_2$, the next two to memory location $M_3$, etc. These stored sample values will be used to produce correlations against at least one reference waveform with the frequency of the desired tone. It should be noted again that any number of phase subregions could be used, for example, an eight subregion (octant) system has been designed by the Applicant. Also, although limiting the sample to +1 or −1 values is preferred, more than two values can be utilized and this can, in fact, be desirable in systems using more than four phase subregions.

In order to detect the desired tone using a correlation scheme, samples must be collected over a period of time. The longer the period of time (observation window) over which the samples used for the correlation are collected, the narrower the acceptance bandwidth of the detection system for a given detect threshold. Unfortunately, in order to meet the bandwidth requirements for a continuous tone control squelch system, the observation time window needed is too long to meet the required standards for detection times. As a result, a pseudo continuous approach is used in which an observation time window of length T, long enough (approximately 330 milliseconds in the preferred embodiment) to provide sufficient bandwidth and noise falsing immunity for a continuous tone control squelch system, is divided into N time intervals (referred to as time subwindows). At the end of each subwindow a correlation is performed against at least one local reference waveform based on the most recent T seconds of sample data.

Thus, in the preferred embodiment, the control logic 26 adds 39 samples to the four quadrant memory locations $M_1$ through $M_4$ during each time subwindow obtaining phase quadrant subtotals for each time subwindow. After 39 samples have been accumulated, the control logic 26 performs correlations against two orthoganal local reference waves using the last nine subwindow phase quadrant subtotals. The data from the last nine subwindows is stored in the sample matrix memory 28. A sine correlation (CS) value is determined according to the expression $CS = |M_1 + M_2 - M_3 - M_4|$ and a cosine correlation value (CC) according to the expression $CC = |M_1 - M_2 - M_3 + M_4|$. New correlation values are determined after each subwindow using the phase quadrant subtotals for the most recent nine time subwindows. The resulting values are then added to obtain a correlation total and compared at the end of each subwindow to a threshold value of 91 to make a tone detection decision. Once a tone has been detected, the detect threshold is lowered to 48, thus providing detect threshold hysteresis.

Standard continuous tone control squelch systems require that once a tone has been detected, a state of no detect must be reached more quickly than if the tone had simply been removed, in oder to avoid an annoying squelch tail. This is accomplished by using a "reverse burst" by suddenly phase shifting the tone signal by 180 degrees. Because of the characteristics of the mechanical vibrating reeds commonly used, a 240 degree shift is actually utilized to shutdown the detector in conventional systems, which corresponds to a shift in the reed resonant frequency. In a correlation detection system, the sudden shift causes the detector to see a rising signal when it otherwise would have seen a falling one and vice versa. As a result, whatever digital quantity the detector has built up, will begin to fall. How quickly it falls below the threshold, and therefore how quickly a loss of tone detect occurs, is determined by signal quality and by how far above the threshold the correlation was at the start of the phase shifted signal. Thus, to achieve a shorter turn off in a correlation system, the correlation totals can be limited by limiting the number of samples used once a tone detection has occurred. This limits the amount that the correlation totals must fall in order to drop below the threshold.

Thus, according to another feature of the invention, floating submatrix limiting is provided to obtain reverse burst turn off times adequate to meet required standards for continuous tone controlled squelch systems. After a tone detection, the control logic 26 compares the correlation total to a reverse burst limit threshold. This threshold is set sufficiently above the initial detect threshold to assure that a strong correlation has been built up before starting to limit, in order to prevent limiting from driving the correlations below the initial detection level. When the reverse burst limit threshold is exceeded, sample matrix is limited to a lesser number of subwindows (seven in the preferred embodiment), thus a smaller number of subwindows are used to obtain the correlation total. When the correlation total drops below a limit drop out threshold, the total number of subwindows used is increased to normal. The number of subwindows removed depends upon the subwindow size relative to the entire matrix and the amount of limiting required to achieve the desired turn off time.

In the preferred embodiment, when the correlation total exceeds a reverse burst limit threshold of 133 at the end of a time subwindow, the control logic 26 shifts to a reverse burst mode. In the reverse burst mode the next subwindow is defined to be a new bottom for the sample matrix, then following two subwindows are eliminated from the sample matrix and the correlation values for these two subwindows following the new bottom are subtracted from the correlation total. These two subwindows are not used again until the correlation total falls below a limit drop out threshold of 67. Because the eliminated subwindows can occur anywhere in the matrix, the limited submatrix is said to be floating. The detect frequency of the novel detector is shifted 1,2 HZ when the detector is in the reverse burst mode so that the approximately 240 degree phase shift of the reverse burst tone relative to the desired tone frequency $f_o$ will be 180 degrees relative to the shifted tone. The amount of the frequency shift required is determined by the design bandwidth of the system.

In conventional continuous tone control squelch systems using mechanical reed detectors, a sudden 240 degree phase shift on a tone channel adjacent to the desired tone (within approximately ±3.5 HZ) can cause a momentary false detect of the desired tone. These false detects are fundamental to matched filter detectors such as mechanical reed detectors and the Applicant's novel correlation detector.

According to still another feature of the invention, background detection is provided to anticipate and correct this reverse burst false detect problem. A second background detector is centered on the frequency of the desired tone but with bandwidth characteristics such that it detects adjacent tone channels as well. This detector can be of any of the available types including mechanical reed detectors, but is preferably a correlation detector. The background detector will find not only the center frequency tone, but also nearby tones. If the main detector determines that the correlation total is above the detect threshold, background detector is checked to determine if it has sensed a tone for longer than the time period required for a detection by the main detector. If the background detector has such a detection, then it is assumed that an adjacent tone has been present and that there was a reverse burst on the adjacent tone which caused a false detect. No detect is allowed as a result and the system is reinitialized. Since the wide bandwidth of the background detector allows quick detection, if the background detect has been for less than the time needed for the main detector to detect a tone, then the detect is allowed.

It is preferred that the background detector be a correlation detector using the same samples and reference phase quadrant memory locations $M_1$, $M_2$, $M_3$, $M_4$ as the main detector, except that the tone detect decisions are based on fewer subwindows. Thus, in the preferred embodiment the background detector is a correlation detector based upon the samples of three time subwindows. At the end of the three subwindows, the background detector memory is cleared, the detection decision is stored, and the background detector continues correlating using samples over the next three time subwindows. When the main detector correlation total exceeds the initial detect threshold of 91, a check is made to be sure less than 7 detections by the background detector have been stored before a tone detect is allowed.

Figure 2A:
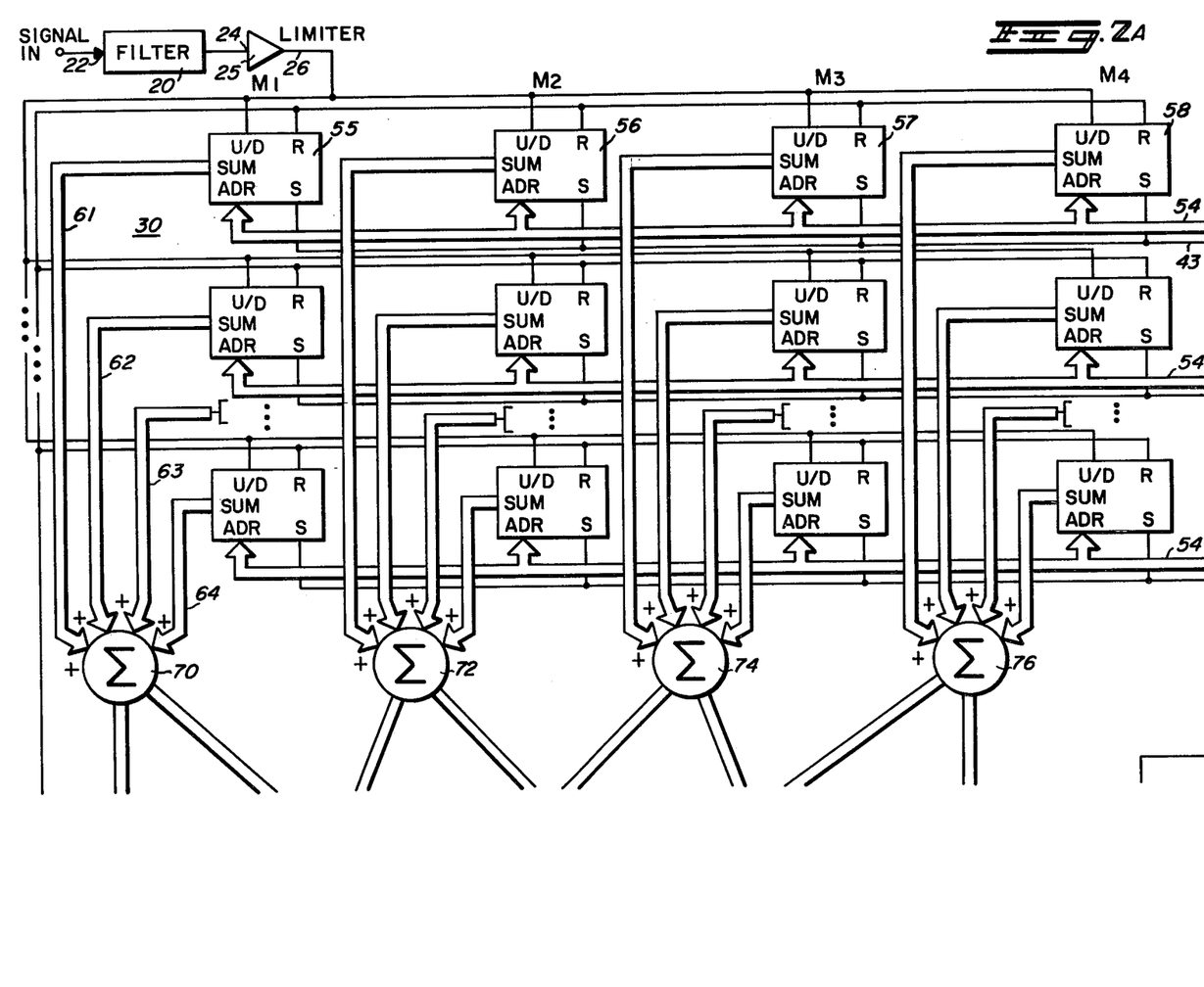
FIG. 2A is a detailed block diagram of the counter matrix section of a digital pseudo continuous correlation tone detector according to the invention.
Figure 2B:
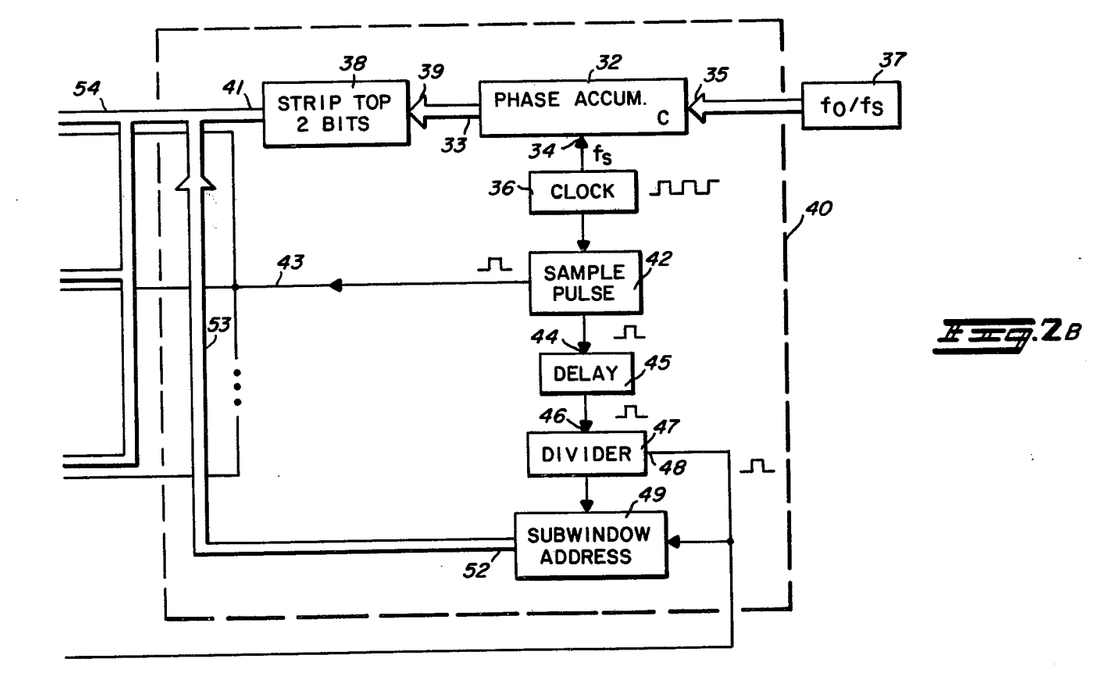
FIG. 2B is a detailed block diagram of the control circuitry section of a digital pseudo continuous correlation tone detector according to the invention.
Figure 2C:
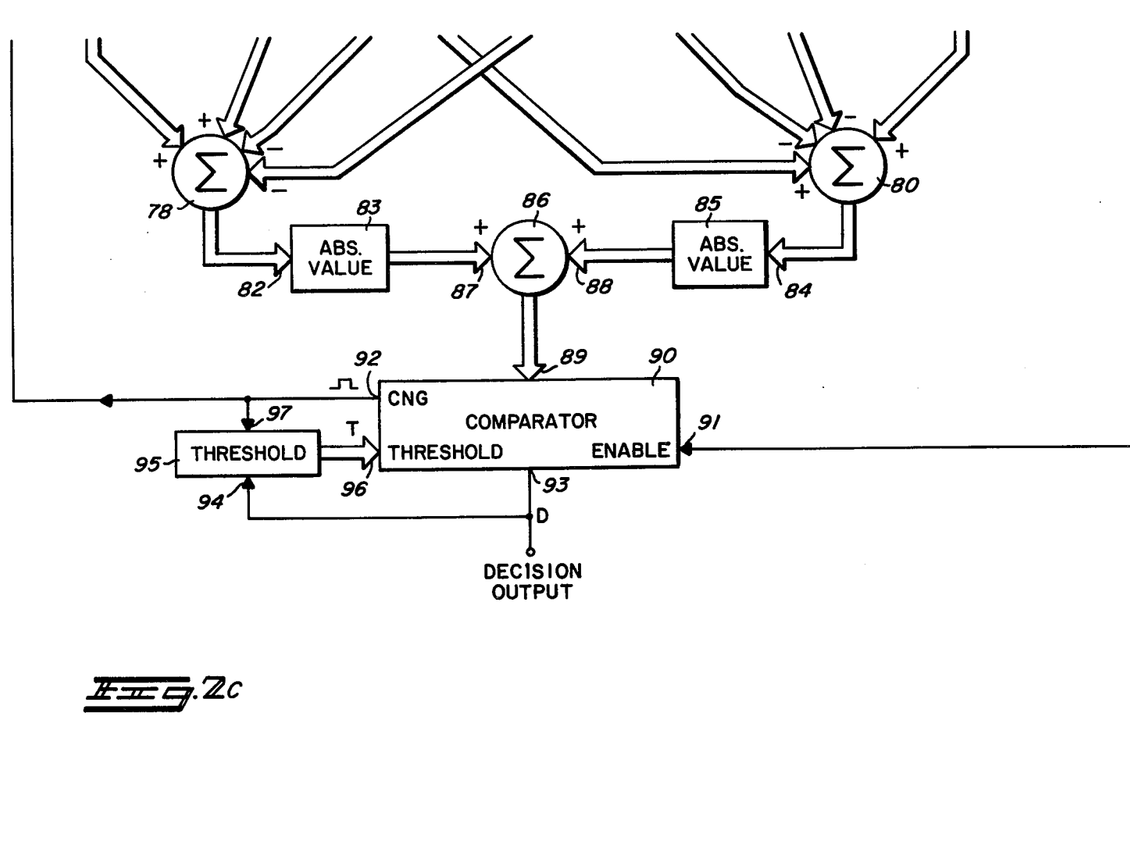
FIG. 2C is a detailed block diagram of the correlation section of a digital pseudo continuous correlation tone detector according to the invention.

FIGS. 2A, 2B and 2C show a detailed block diagram of a digital pseudo continuous correlation tone detector according to the invention. As shown in FIG. 2A, a signal, normally from the discriminator of a receiver, is applied at an input terminal 22 of a filter 20 which is preferably a low pass filter. The filtered output of the filter 20 is coupled directly to an input terminal 24 of a limiter 25 where the filtered signal is limited to transform it into essentially a rectangular waveform with only a high or a low level, at an output terminal 26. The limiter output terminal 26 is coupled to the up/down (U/D) input of each up/down counter in a matrix of up/down counters indicated generally at 30. These counters of the matrix 30 are arranged in four columns, as shown, labelled $M_1$, $M_2$, $M_3$, $M_4$. Each column is comprised of a plurality of counters equal to the number of time subwindows used by the system (although nine are used in the preferred embodiment, only three are shown). Each counter is incremented by 1 if the level on its U/D input is high and decremented by one if the level on its U/D input in low, if at the same time, its unique address is present on its ADR input and a sample pulse occurs on the S input. All counters in the counter matrix 30 which are not addressed remain unchanged.

The address signals for the up/down counters of counter matrix 30 are generated by the control circuitry 40 shown in FIG. 2B. Control circuitry 40 includes a phase accumulator 32 which comprises a multibit binary adder and register (not shown in detail) which are used to generate an address signal on an output bus 33. A sample clock signal with frequency equal to the sampling frequency $f_s$ is generated by an oscillator 36 and applied to the C input 34 of the phase accumulator 32. An input terminal 35 is provided which is coupled to a programmable utility memory location 37 in which a phase increment value equal to $f_0/f_s$ is stored where $f_o$ is the frequency of the desired tone to be detected. This value $f_o/f_s$ is the phase change that occurs in the local reference waveform in the interval between sampling clock pulses. The fraction $f_0/f_s$ is added to the accumulator at each sampling pulse from the clock 36, using modulo 2 addition. On overflow of the adder, the ones are dropped leaving only the fractional part. The value in the accumulator is a binary fraction between 0 and 1 with the two most significant bits corresponding to one of four phase quadrants of a local reference waveform with frequency $f_o$. Therefore, upon each sample clock pulse the phase accumulator will be incremented by the phase increment $f_o/f_s$, and the two most signficant bits can be used as address bits for the up/down counters of matrix 30 (see FIG. 2A). The phase accumulator value is coupled from the output terminal 33 to the input terminal 39 of a circuit 38 which drops all but the two most significant bits. The two most significant bits are coupled to the address bus 54 via the phase address bus 41.

The signal from the sample clock 36 is also applied to a sample pulser 42 which generates a sampling pulse on the sample control line 43 during each cycle of the sample clock signal. The sample pulse signal on the sample control line 43 is coupled to the sample input (S input) of each of the counters in the counter matrix 30 (see FIG. 2A). When the pulse occurs, the addressed counter in the counter matrix 30 will sample the signal on its U/D input and will be incremented or decremented accordingly.

The sample pulse signal is also coupled to the input terminal 44 of a delay circuit 45 as shown in FIG. 2B. The delay circuit 45 generates a delay pulse on its output terminal 46 which is coupled to a divider 47. The delay is necessary to allow for the settling time of the circuits in the system.

The divider 47 frequency divides the signal from the delay circuit 45 by the number of samples per subwindow and generates a subwindow pulse on the output terminal 48 at the end of each time subwindow. The output terminal 48 is coupled to a subwindow address counter 49. The subwindow address counter increments an address which is applied to its output terminal 52 and coupled to the address bus 54 via a subwindow address bus 53. The subwindow address contains the most significant bits of the up/down counter address and is combined with the two bits from the phase address bus 41. Thus, the full address on the address bus 54 is composed of the subwindow address bits which determine which row of the matrix is addressed (each row representing a different subwindow), and the two phase address bits which determine which of the four up/down counters (i.e. which column $M_1$–$M_4$) will be addressed in the subwindow row. All address bits are coupled to the ADR input of each up/down counter.

Consequently, the matrix 30 of FIG. 2A will be addressed so that each row will be addressed for a time subwindow. During that time each up/down counter will be addressed sequentially so as to sample the input signal and add the sample to the correct phase quadrant memory location $M_1$, $M_2$, $M_3$, $M_4$, when the sample pulse occurs. For example, assuming the first subwindow row composed of the counters 55, 56, 57, 58, is addressed, then the two bits from the phase accumulator 32 would first address the counter 55 assuming the phase accumulator begins at zero. When the sample pulse occurs, on the sample control line 43, the counter 55 would be incremented or decremented depending upon whether the signal on the U/D input was high or low. Then, the phase accumulator 32 (see FIG. 2B) would be incremented by $f_o/f_s$. Depending on the value of $f_o/f_s$, eventually the phase accumulator would be incremented enough to cause the two most significant bits to address the next counter 56 (see FIG1 2A). Up until that occurs, upon each sample pulse on the sample control line 43, the first counter 55 would be incremented or decremented. When the second counter 56 is addressed, then counter 56 will sample the signal upon each sample pulse on the S input from the sample control line 43. In this way, each counter accumulates the input samples for its quadrant of the local reference waveform.

As the samples are being taken, the total sum in each counter is applied to a SUM output terminal (for example, see the SUM output terminal 57 of the up/down counter 55). The totals for each counter in each column are applied to summing circuits 70, 72, 74, 76 via a set of SUM busses. For example, the totals from column $M_1$ are coupled to the summing circuit 70 via the SUM busses 61, 62, 63 and 64 where bus 63 represents the SUM bus for all those counters not shown. As a result, summing circuit 70 produces a total sample sum $M_1$, summing circuit 72 produces a total sample sum $M_2$, summing circuit 74 produces a total sample sum $M_3$, and summing circuit 76 produces a total sample sum $M_4$. These total sample sums are then coupled to two adding circuits 78, 80, as shown in FIG. 2C. The sample totals are coupled to the adding circuit 78 such that the $M_1$ and $M_2$ sample totals are added and the $M_3$ and $M_4$ totals are subtracted. The sample totals are coupled to the adding circuit 80 such that the $M_1$ sample total and the $M_4$ sample total are added and the $M_2$ and $M_3$ sample totals are subtracted. The resulting value from the adding circuit 78 is applied to the input 82 of the absolute value circuit 83 which takes the absolute value of the quantity applied to its input 82. The resulting quantity is the sine correlation value given by $CS = |M_1 + M_2 - M_3 - M_4|$. The resulting quantity from the adder circuit 80 is applied to the input 84 of the absolute value circuit 85 which takes the absolute value of the quantity applied to its output 84. The resulting output is the cosine correlation value given by $CC = |M_1 - M_2 + M_3 + M_4|$. These two correlation values are then applied to the summing circuit 86 at its inputs 87 and 88. The summing circuit 86 adds the two correlation values obtaining a correlation total which is applied to the input 89 of the comparator 90. Another input 91 to the comparator 90 is coupled directly to the subwindow divider 47 (shown in FIG. 2B) so that a subwindow pulse is applied to the enable input 91. When a subwindow pulse occurs on the enable input 91 of the comparator 91, the correlation total applied to the input 89 is compared to a threshold value. Thus, at the end of each subwindow a decision is made by comparing the correlation total to the threshold. If the correlation total exceeds the threshold, a decision output signal is generated on the decision output 93. The decision output terminal 93 is also coupled to the input terminal 94 of threshold circuit 95. As a result, when a decision output occurs on output terminal 93, a high level is applied to the input terminal 94 of the threshold circuit 95 which changes to a new lower threshold. The new lower threshold is then applied to the threshold input 96 of the comparator 90. This results in the comparator 90 comparing the correlation total on its input 89 to a new lower threshold applied to its input 96 after the initial detect occurs. If upon a comparison being made, the decision output 93 goes low because the correlation total applied at input 89 does not exceed the threshold applied at input 96, then the threshold circuit will revert back to the original higher threshold. In addition, the change output 92 is coupled to the reset inputs of all the counters in the counter matrix 30 (see FIG. 2A). As a result, all of the counters of the subwindow row which is addressed at the time the reset pulse occurs are cleared. Thus, once a decision determination has been made, the counters for the next subwindow to take samples will be cleared to prepare them to accumulate a new set of samples.

It can be seen that the above described is a hardware embodiment of a pseudo continuous digital correlation tone detector with threshold hysteresis. However, by programming a microcomputer system to perform the function of the control logic, a less expensive and preferred embodiment of the invention can be implemented.

Figure 3:
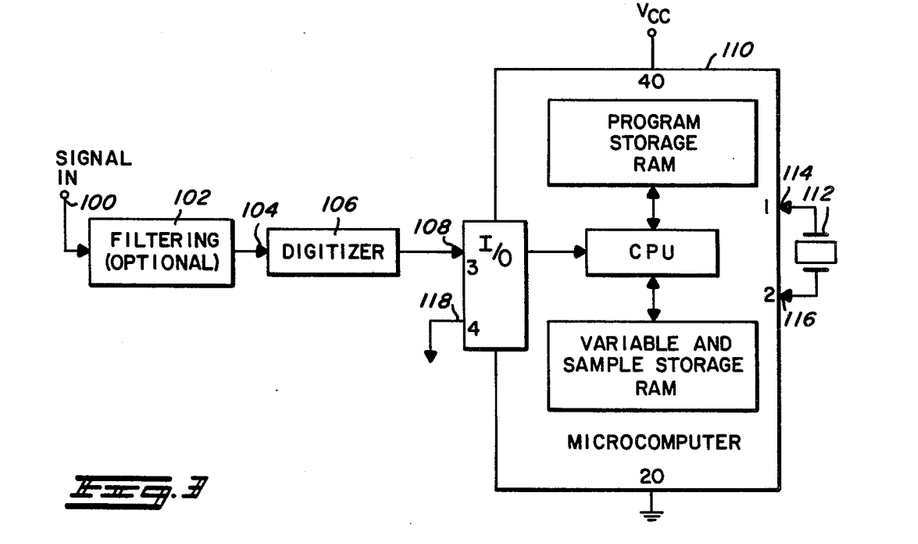
FIG. 3 is a block diagram illustrating a microcomputer implementation of the preferred embodiment of the invention.

FIG. 3 illustrates the preferred embodiment of the invention wherein the control logic and memory are realized via a standard microcomputer. The microcomputer shown in FIG. 3 is preferably the commercially available MOSTEK 3870 microcomputer chip. The signal to be processed is applied to the input terminal 100 of an optional filter 102. The filtered signal from the filter 102 is coupled to the input terminal 104 of the limiter (digitizer) 106. The limited output signal from the limiter 106 is coupled to the I/O input 108 of a microcomputer 110. A clock crystal 112 is coupled to the clock inputs 114 and 116. The microcomputer 110 will sample the limited signal applied to its input 108, process the sampled information and when the presence of the desired tone is detected, generate a detect indication on a detect output 118. Also shown are the typical pin numbers that would be used when utilizing a MOSTEK 3870. The preferred microcomputer chip, the MOSTEK 3870, includes the necessary ROM and RAM required for the program. However, a microprocessor with peripheral devices to accomplish the same functions could also be utilized.

Figure 4:
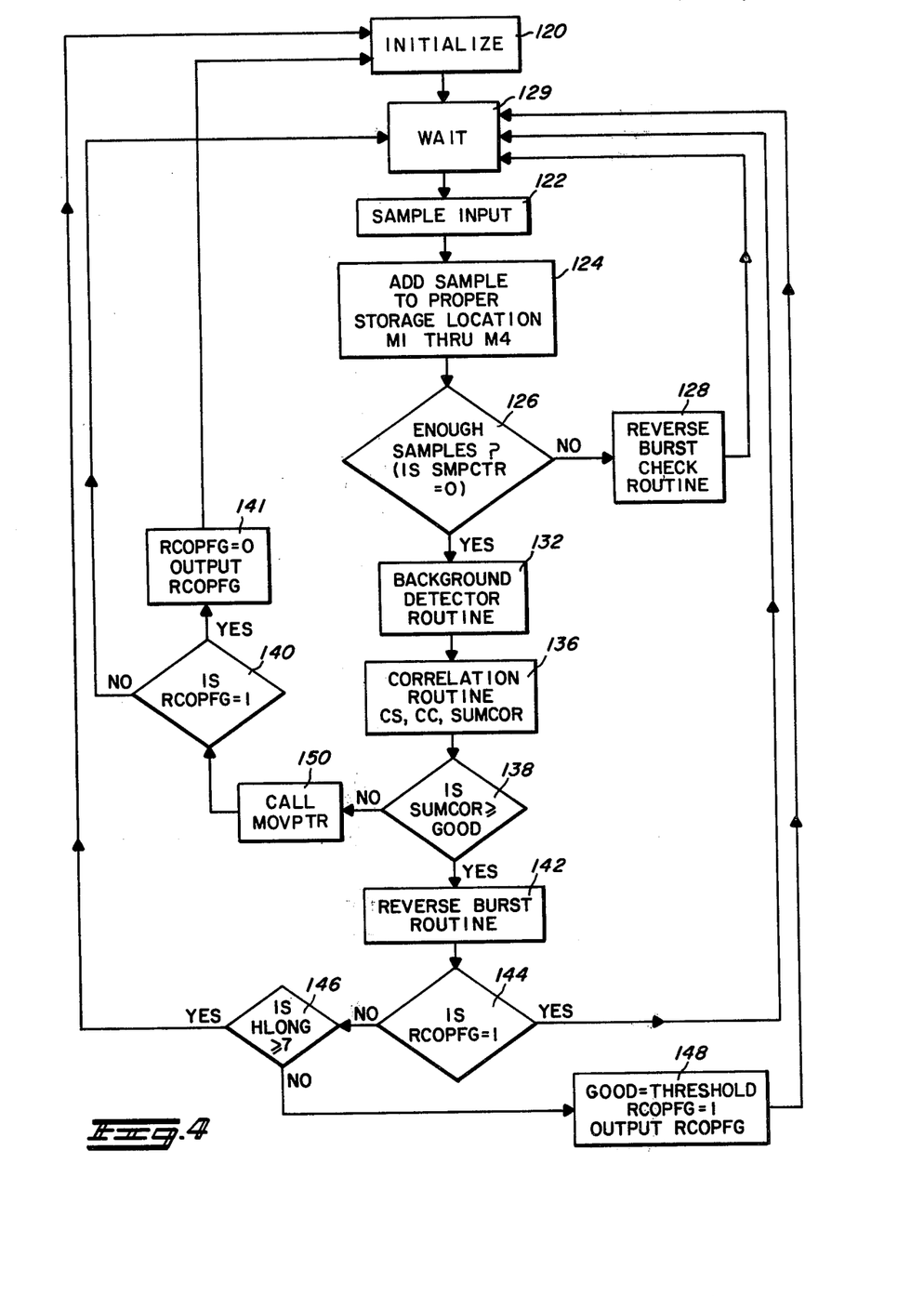
FIG. 4 is an overall flow diagram of the computer program for the invention.

FIG. 4 is a general program flow diagram for the microcomputer of FIG. 3 to implement the present invention as shown in FIG. 3. Each of the routines described will be discussed later in greater detail where required, in conjunction with the accompanying drawings. An INITIALIZE routine 120 sets the initial values and triggers the initial operation of the program sequence. From the INITIALIZE routine 120, program flow proceeds to a WAIT routine 129. The WAIT routine 129 provides the necessary delay between operations so that samples are taken at the proper intervals. During this waiting period, the microcomputer can be used to perform other functions. After the necessary delay has occurred during the WAIT routine 129, program flow proceeds to the sample block 122. At this point, the microcomputer samples the input signal applied to the input 108 and program flow proceeds to the next program routine 124. The routine 124 identifies the proper memory storage location for the sample according to the phase of a local reference waveform of frequency $f_o$. The sample is then stored in the appropriate memory location indicated as $M_1$ through $M_4$.

Once a sample has been stored in its proper location, program flow passes to decision block 126 which checks to determine if the 39 samples for a subwindow have been taken. If there have not been enough samples for a subwindow, program flow proceeds to the REVERSE BURST check routine 128. At this point a check is made to determine whether the reverse burst limited submatrix is required. If so, the routine establishes the floating submatrix and returns program control to the WAIT routine 129. In the WAIT routine 129 enough delay is established so that the next sample is taken at block 122 after the necessary delay. If, however, the 39 samples needed to form a subwindow had been taken, then program control proceeds to the BACKGROUND DETECTOR routine 132. This routine performs the necessary correlation calculations on three subwindows of samples and stores the result. Program control then proceeds to block 136 where correlation values are determined and stored in correlation matrices CS and CC and where a correlation total SUMCOR is determined. Following these calculations, the program control proceeds to decision block 138 where the correlation total SUMCOR is compared to the threshold GOOD. If the correlation total SUMCOR is greater than or equal to the threshold GOOD, then program control proceeds to the REVERSE BURST routine 142. In the REVERSE BURST routine 142 it is determined whether the reverse burst floating submatrix is required and, if so, appropriate values are set to establish the floating submatrix. Program will then proceed to decision block 144 where the decision flag RCOPFG is checked to determine whether a detect had occurred previously. If a previous detect had been allowed, then program control proceeds to the WAIT routine 129 where the necessary delay is established before taking the next sample. If a detect had not previously been allowed, then program control proceeds to decision block 146 where the background detector variable HLONG is checked to determine if the detect was the result of an adjacent channel reverse burst or a real detect. If the detect was a false detect, then the variable HLONG will be greater than or equal to 7 and the program control will be passed to the INITIALIZE routine where the program will be reinitialized. If the variable HLONG is less than 7, then an allowed detect can occur and program control will proceed to block 148. At block 148 the threshold GOOD will be set to a new lower threshold, and the detect flag RCOPFG will be set and output. Program control will then be passed back to the WAIT routine 129 where the necessary delay will be established before the next sample is taken. If, at the decision block 138, it is found that the correlation sum is less than the threshold GOOD, then program control will pass to block 150. At block 150 the subroutine MOVPTR is called. This subroutine determines the location of the subwindow where the next samples will be stored. Program control will then pass to decision block 140 where the detect flag RCOPFG is checked to determine if an allowed detect had occurred. If the detect flag had been set indicating an allowed detect had occurred, then the detect flag RCOPFG is cleared to zero at block 141 and is output. Program control then proceeds to the INITIALIZE routine where the entire program is reinitialized. If the detect flag RCOPFG had not been set indicating that no detect had occurred previously, then program control proceeds to the WAIT routine 129 where the appropriate delay is established before the next sample is taken.

Figure 5:
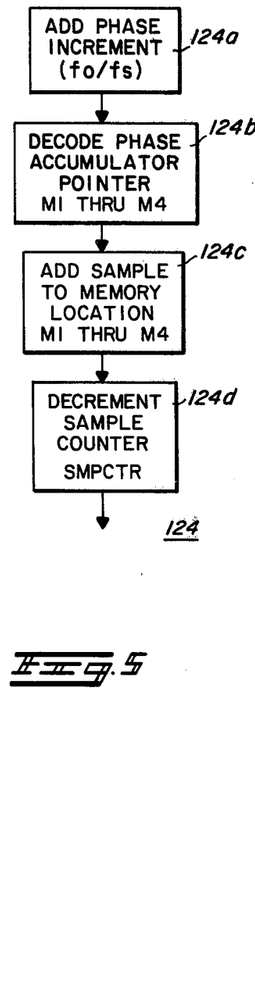
FIG. 5 is a program flow diagram for the sample storage routine of the computer program for the invention.

After a sample has been input as shown at block 122 in FIG. 4, program control proceeds to block 124 which is shown in greater detail in FIG. 5. Referring now to FIG. 5 routine 124 is entered at block 124a. At this point the phase increment equal to $f_o/f_s$ is added to a phase accumulator. After the addition of the phase increment had occurred, the phase accumulator is decoded as indicated at block 124b by using the two most significant bits of the accumulator as a pointer to identify one of the four phase quadrant memory locations, $M_1, M_2, M_3, M_4$. Once the proper memory location has been identified by the phase accumulator pointer, then, as indicated at block 124c, the sample is added to the memory location identified to give a subwindow subtotal for each phase quadrant. At this point sample counter SMPCTR is decremened as indicated in block 124d. The sample counter is initially set to 39 in INITIALIZE routine 120 shown in FIG. 4. When it has been decremented all the way to zero, this will indicate that enough samples have been taken for a subwindow. At the end of the subwindow a sunwindow subtotal will have been accumulated for each phase quadrant in memory locations $M_1$ through $M_4$. When program control passes from block 124d, it will proceed to decision block 126 of FIG. 4 where the sample counter is checked to determine if it has reached zero. If the sample counter SMPCTR equals zero, then the end of a subwindow has been reached and program control will pass to the BACKGROUND DETECTOR routine indicated at block 132 of FIG. 4.

Figure 6:
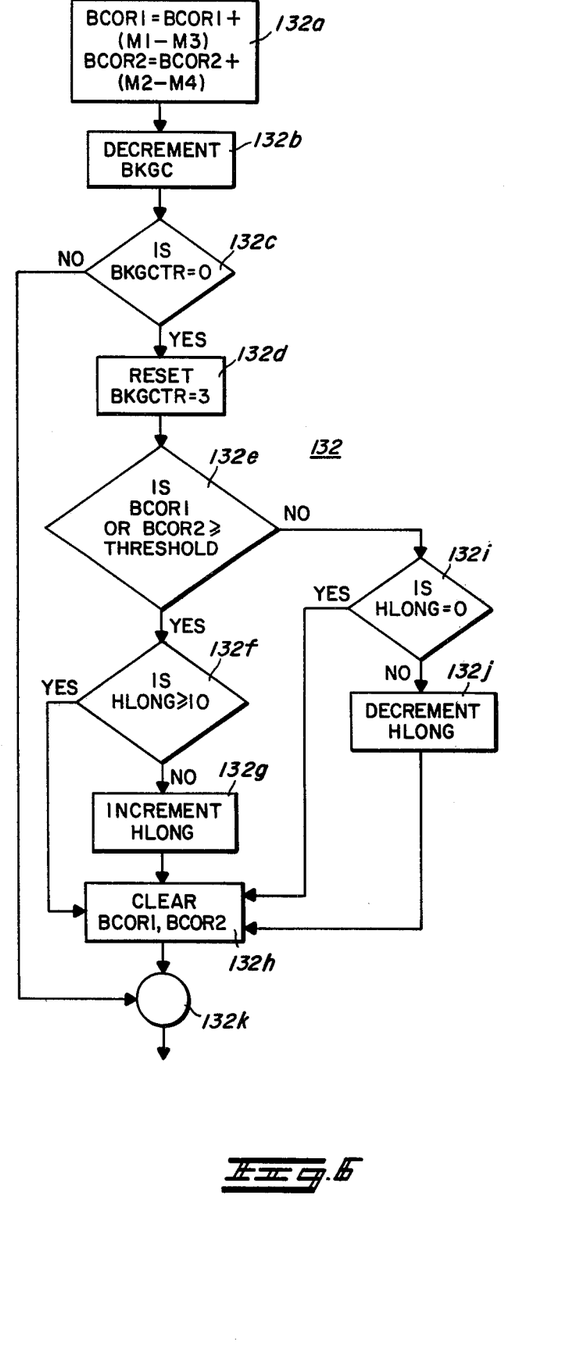
FIG. 6 is a program flow diagram for the BACKGROUND DETECTOR routine of the computer program for the invention.

The BACKGROUND DETECTOR routine 132 of FIG. 4 is shown in greater detail in FIG. 6. This routine is entered at block 132a in which the background correlation values are calculated. In the BACKGROUND DETECTOR routine, there are two correlation values determined, labelled BCOR1 and BCOR2. BCOR1 is a correlation value made up of the $M_1$ subwindow subtotal minus the $M_2$ subwindow subtotal for up to three consecutive subwindows. The BCOR2 correlation value is the $M_2$ subwindow subtotal minus the $M_4$ subwindow subtotal for up to three consecutive subwindows. After $M_1$ $_{minus}$ $_{M3}$ and $M_2$ minus $M_4$ for the last subwindow is added to MCOR1 and MCOR2, respectively, the background counter BKGCTR is decremented as shown in block 132b. The background counter variable BKGCTR is originally set to three in the INITIALIZE routine shown at 120 in FIG. 4. Once the background counter has been decremented, program flow proceeds to decision block 132c where the background counter is checked to determine if it is zero. If the background counter BKGCTR is equal to zero, this indicates that three subwindows have been used to make the background correlation value and therefore a correlation test can be made. If the background counter is not equal to zero, this means that there are less than three subwindows of correlation values and therefore not a sufficient number of samples to make a correlation test. Therefore, the program flow will jump to connection point 132k as shown and will proceed to the next routine indicated as block 136 in FIG. 4. If the background counter is equal to zero indicating a correlation test can be made, the background counter is reset to three as shown in block 132d and program flow proceeds to the decision block 132e. At this point the absolute value of BCOR1 and the absolute value of BCOR2 are tested sequentially to see if either is greater than or equal to the background threshold. If neither is greater than nor equal to the threshold, then this indicates that no tone is being detected on either the center channel or the adjacent channels and the program flow proceeds to decision block 132i. At decision block 132i the variable HLONG is checked to determine if it is equal to zero, if not, it is decremented as shown in block 132j. If it is already zero, then program flow proceeds to block 132h as shown in FIG. 6. If the absolute value of BCOR1 of the absolute value of BCOR2 is greater than or equal to the threshold, this indicates that a tone has been detected on either the center channel of the adjacent channels and program flow proceeds to decision block 132f. At this point the variable HLONG is checked to determine if it is equal to or greater than 10. If it is, program flow proceeds to connection point 132k and from there to the next routine indicated as block 136 of FIG. 4. If the variable HLONG is less than 10, then the variable HLONG is incremented as shown in block 132g and program flow proceeds to block 132h. The value of HLONG is thereby constrained between zero and ten to prevent the value in the microcomputer memory location from rolling over or rolling under. At this point the correlation values BCOR1 and BCOR2 are cleared to prepare the background routine for the next set of three subwindow correlations. Program flow then proceeds to connection point 132K and from there to the next routine indicated at 136 in FIG. 4. The net result of the background routine is that at every three subwindows, a correlation is performed and, if a detection occurs, a variable HLONG is incremented to store the effective detection and whenever a detection does not occur at the end of three subwindows, the variable HLONG is decremented to indicate a lack of detection. Thus, the value of HLONG represents a probability that an undesired tone has been detected.

Figure 7:
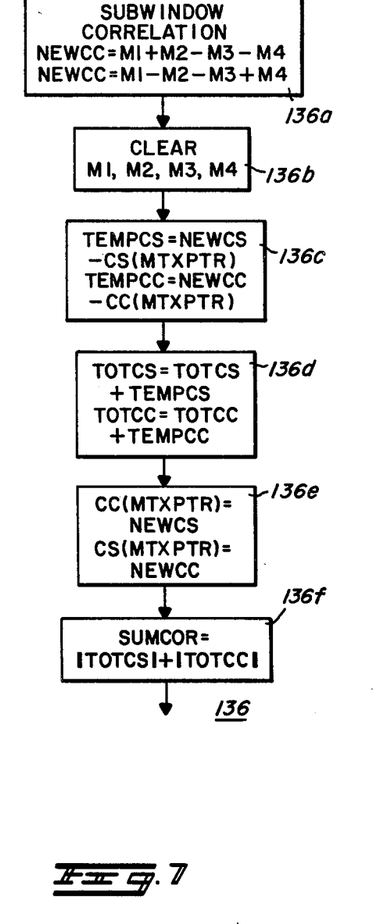
FIG. 7 is a program flow diagram for the CORRELATION routine of the computer program for the invention.

After the BACKGROUND DETECTOR routine 132, program flow proceeds to determine the correlation total values as indicated at 136 of FIG. 4. The CORRELATION routine 136 of FIG. 4 is shown in greater detail in FIG. 7. Referring now to FIG. 7, the CORRELATION TOTAL routine is entered at block 136a at which the subwindow correlation values NEWCS and NEWCC are calculated. NEWCS is the value of the sine correlation for the latest subwindow, which is equal to $M_1+M_2-M_3-M_4$ and the variable NEWCC is the cosine correlation for the latest subwindow and is equal to $M_1-M_2-M_3+M_4$. After the subwindow correlation calculation takes place, program flow proceeds to block 136b where the memory locations $M_1$, $M_2$, $M_3$ and $M_4$ are cleared in preparation for the next subwindow sample accumulation. Program flow then proceeds to block 136c where a value TEMPCS and TEMPCC are calculated. TEMPCS is equal to the latest subwindow correlation value NEWCS minus the oldest existing value in the sine correlation matrix CS. The exact location in the matrix is determined by the matrix pointer MTXPTR whose value is set initially in the INITIALIZE routine. The value of the variable TEMPCC is equal to the latest subwindow cosine correlation value NEWCC minus the oldest existing correlation value in the cosine correlation matrix CC indicated by the value of the matrix pointer MTXPTR. After this calculation occurs, program flow proceeds to 136d as shown where total sine and total cosine correlation values are determined. The total sine correlation value TOTCS is determined by adding the previously calculated value TEMPCS to the existing total sine correlation value TOTCS. The total cosine correlation value TOTCC is given by the total correlation value existing TOTCC plus the value of TEMPCC calculated above. After the calculation of the total correlation values at 136d program flow proceeds to block 136e where the new sine correlation value NEWCS for the latest subwindow location determined by the matrix pointer MTXPTR is used to replace the previous value in the sine correlation matrix CS and the new cosine correlation value NEWCC for the latest subwindow is used to replace the old cosine correlation value in the cosine correlation matrix CC. The net result of this is that the total correlation values TOTCS and TOTCC respectively are equal to the sum of all the correlation values in each correlation matrix CS and CC. In other words, the total correlation values TOTCS and TOTCC are the total correlation sums against the two orthoganal references for all of the subwindows used to form the full observation window. In the preferred embodiment, the total number of subwindows is equal to 9. Program flow then proceeds to block 136f where the value SUMCOR is calculated by adding the absolute value of the total sine correlation value TOTCS to the absolute value of the total cosine correlation value TOTCC. Program flow then proceeds out of the CORRELATION routine indicated at 136 in FIG. 4 to the decision block 138 shown in FIG. 4. At this point, the correlation sum SUMCOR is compared to the threshold value GOOD which is initially set in the INITIALIZE routine 120. The preferred value for the initial threshold value is 91.

Figure 8:
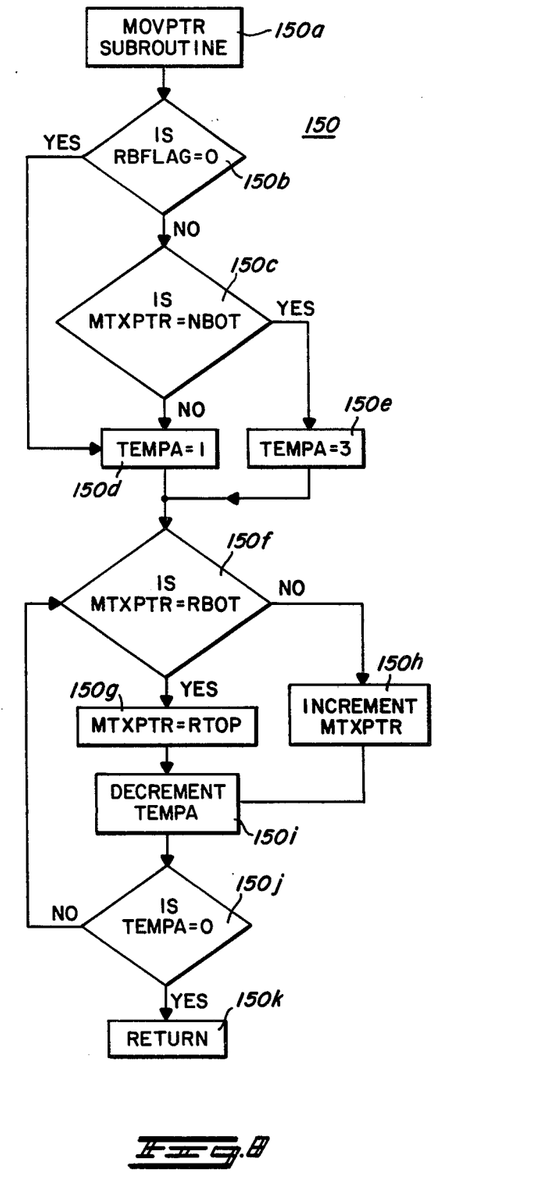
FIG. 8 is a program flow diagram for the MOVPTR subroutine of the computer program for the invention.

If the correlation sum SUMCOR is not greater than or equal to the threshold value GOOD, then program flow proceeds to block 150 which calls the MOVPTR subroutine. The MOVPTR subroutine is shown in greater detail in FIG. 8. As shown in FIG. 8, the MOVPTR subroutine is entered at block 150a and program flow proceeds to decision block 150b where the reverse burst flag RBFLAG is checked to determine if it is equal to zero. If the reverse burst flag is equal to zero, this means that the REVERSE BURST mode has not been entered and the correlation matrix should not be limited. As a result, program flow proceeds from block 150b to block 150d as shown. At block 150d a temporary variable TEMPA is set equal to one to cause an advance of only one subwindow and program flow proceeds to block 150f. At this point the matrix pointer MTXPTR is checked to determine if it is equal to a value RBOT. The value RBOT is the real bottom of the correlation matrix and is a constant. If the matrix pointer is equal to the real bottom, then the matrix pointer value is set to a value RTOP. RTOP is the real top of the correlation matrix and is a constant. After setting the matrix pointer equal to RTOP, program flow proceeds to block 150i where the value TEMPA is decremented. If the matrix pointer is not equal to RBOT, then this means that the matrix pointer is not at the bottom of the matrix and therefore the matrix pointer MTXPTR is incremented as shown at block 150h. Then program flow proceeds to block 150i where the variable TEMPA is decremented. In the sequence presently being described, the variable TEMPA was set to one, therefore, decrementing it the first time will cause the value to go to zero. Thus, when program flow proceeds as shown to decision block 150j where it is determined whether TEMPA is equal to zero, the value of TEMPA will be zero and program flow will proceed to the return block 150k resulting in the program flow returning to the original position in the program. The overall effect of this sequence is that if the RBFLAG variable is equal to zero, then the matrix pointer MTXPTR will either be incremented if it is not pointing at the bottom of the correlation matrix or it will be reset to the top of the correlation matrix if it is already pointing at the bottom. Thus, in this sequence, the matrix pointer MTXPTR is simply moved to the next subwindow position in the matrix.

Returning now to block 150b of FIG. 8, if the reverse burst flag RBFLAG is not equal to zero, this is an indication that the system is in the REVERSE BURST mode requiring two subwindows to be skipped to limit the matrix. Therefore, program flow will proceed to decision block 150c as shown. At this point it is determined whether the matrix pointer MTXPTR is equal to the variable NBOT. NBOT is the new bottom of the floating submatrix which is set during the REVERSE BURST routine shown as block 142 of FIG. 4. If the matrix pointer MTXPTR is equal to the new bottom, then the temporary variable TEMPA is set equal to three as shown at block 150e in order to move the matrix pointer MTXPTR over the two unused subwindows. If the matrix pointer MTXPTR is not equal to NBOT, then the temporary variable TEMPA is set equal to one as shown at block 150d. Program flow in each case then proceeds to decision block 150f where it is determined whether the matrix pointer MTXPTR is equal to the real bottom. If the matrix pointer is equal to the real bottom, RBOT, then the matrix pointer will be set equal to the real top RTOP as shown in block 150g. Program flow then proceeds to block 150i where the temporary variable TEMPA is decremented. If, however, the matrix pointer MTXPTR is not equal to the real bottom, then the matrix pointer is incremented as shown in block 150h and program flow then proceeds again to block 150i where TEMPA is decremented. After TEMPA is decremented, program flow proceeds to the decision block 150j where it is determined whether TEMPA is equal to zero. If the matrix pointer MTXPTR had not been equal to the new botom NBOT, then TEMPA will be zero after the first decrementing of TEMPA and program flow will proceed to the return block 150k and the subroutine will then return to the main program at the point at which it was called. If, however, the matrix pointer MTXPTR had been equal to NBOT at block 150c, TEMPA would have been set to 3 and TEMPA would therefore not be equal to zero at block 150j after the first decrementing of TEMPA. Therefore, program flow would return to block 150f as shown. As a result, the matrix pointer MTXPTR will skip two locations in the correlation matrix since it will be incremented three times instead of one. After TEMPA has been decremented to zero, program flow will then return to the original point in the program at which the MOVPTR routine was called. The net result is that when in the REVERSE BURST mode, if the matrix pointer MTXPTR is at the new bottom, the matrix pointer will be caused to skip two subwindows in the correlation matrix. If the matrix pointer MTXPTR is at some other point in the matrix, the pointer is caused only to move to the next subwindow. Both of these movement conditions are subject to the rule that, if the matrix pointer MTXPTR is equal to RBOT, the real bottom of the matrix, then the next move brings it to RTOP.

After the MOVPTR subroutine has moved the matrix pointer MTXPTR as required, program flow proceeds from block 150 to decision block 140 as shown in FIG. 4. At block 140, the detect flag RCOPFG is checked to determine whether an allowed detection had previously occurred. It should be recalled that to be at this point in the program it must have been already determined at block 138 that the correlation sum was below the detect threshold. The detect flag must therefore be reset to zero if a detect had previously occurred setting it to one. Therefore, if the detect flag is equal to one, program flow proceeds to block 141 where the detect flag RCOPFG is set to zero and is output to the output port. Program flow then proceeds to the INITIALIZE routine 120 where the program is reinitialized. If, however, the detect flag was not set to one, then program flow proceeds from block 140 to the WAIT routine 129 where the necessary delay is established between samples before the sample is taken at block 122.

Figure 9:
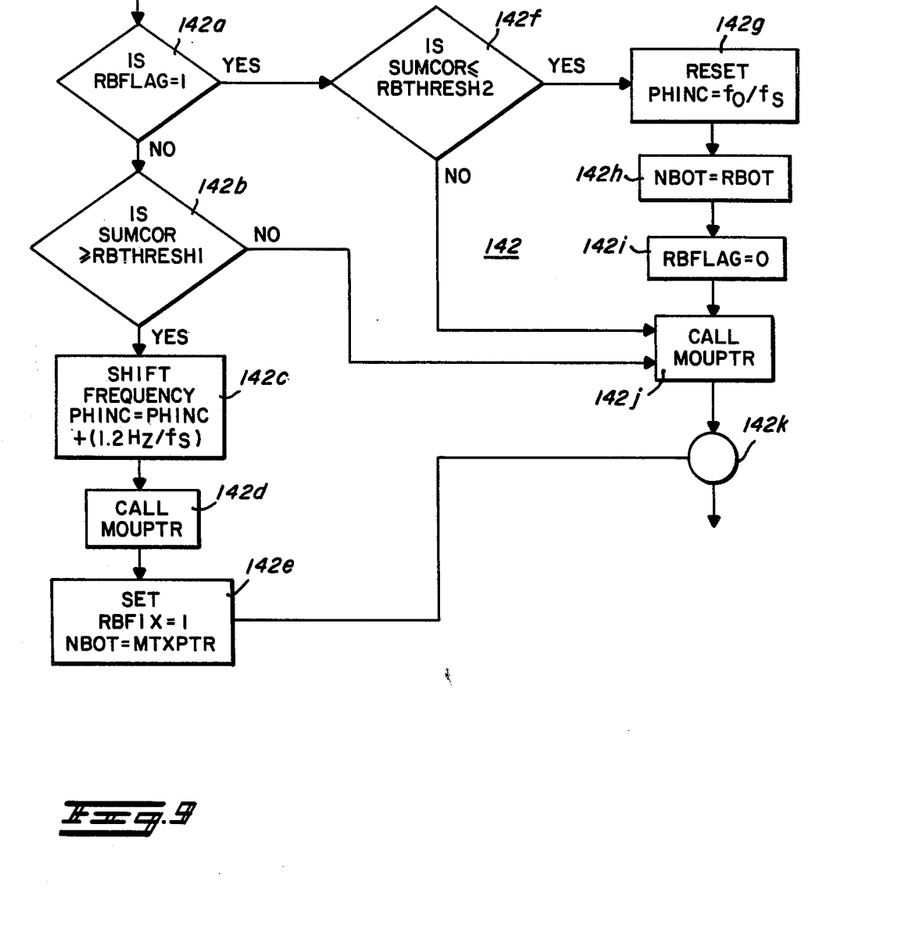
FIG. 9 is a program flow diagram for the REVERSE BURST routine of the computer program for the invention.

Referring back to block 138 of FIG. 4, if the result of the comparison between the correlation sum SUMCOR and the detect threshold GOOD is such that the correlation sum is found to be is greater than or equal to the threshold, then program flow will proceed to the REVERSE BURST routine as shown at block 142 of FIG. 4. The REVERSE BURST routine shown at block 142 is shown in greater detail in FIG. 9. Referring now to FIG. 9, it can be seen that the REVERSE BURST routine is entered at decision block 142a where the reverse burst flag RBFLAG is checked to determine if it is equal to one. If it is not equal to one, this means that the program is not in the REVERSE BURST mode and program flow then proceeds to the decision block 142b. At this point the correlation sum SUMCOR is compared to the reverse burst limit threshold RBTHRESH 1. If the correlation sum is greater than or equal to the reverse burst limit threshold, the program will then be shifted into the reverse burst mode and program flow will therefore proceed to block 142c. At this point the phase increment PHINC is increased by a value corresponding to a frequency shift of 1.2 HZ. Therefore, the phase increment is increased by 1.2 Hz divided by the sample frequency $f_s$. Program flow then proceeds to block 142d where the MOVPTR subroutine is called and the matrix pointer MTXPTR is changed as described previously. After the matrix pointer has been changed, the subroutine returns control to block 142e where the variable RBFIX is set equal to one, and the variable NBOT is set equal to MTXPTR. At this point then, the new bottom of the matrix is established as being equal to the existing position of the matrix pointer MTXPTR and the variable RBFIX is set for use to be described later. Making the new bottom of the matrix equal to the subwindow after RBTHRESH1 has been exceeded, allows the two subwindows following the new bottom, which are to be cleared by the REVERSE BURST CHECK routine 128, to be immediately reused if such clearing drops the value of SUMCOR below the drop-out threshold RBTHRESH2. Program flow then proceeds to connection point 142k from which the program will then proceed to block 144 of FIG. 4.

If, however, the RBFLAG variable is equal to one, this indicates that the reverse burst mode has already been entered and program flow will therefore proceed to the decision block 142f. At decision block 142f it is determined whether the correlation sum SUMCOR is less than or equal to the reverse burst drop-out threshold RBTHRESH2. If the correlation sum is less than or equal to the reverse burst drop-out threshold, then the system must come out of the REVERSE BURST mode. Therefore, program flow proceeds to block 142g where the phase increment PHINC is reset to be equal to $f_o/f_s$ eliminating the reverse burst frequency shift. Then, program flow proceeds to block 142h where NBOT is set equal to RBOT. This sets the new bottom value equal to the real bottom value of the correlation matrix thereby adding the two dropped subwindows back into the matrix. Program flow then proceeds to block 142i where the variable RBFLAG is set equal to zero to indicate that the system is no longer in the REVERSE BURST mode. Program flow then proceeds to block 142j where the MOVPTR subroutine is called in order to change the matrix pointer MTXPTR to the required value as described previously.

If the correlation sum is not less than or equal to the reverse burst hysteresis drop-out RBTHRESH2, then program control proceeds directly to block 142j as shown. At this point the MOVPTR subroutine is called and the matrix pointer MTXPTR is incremented as required. Program flow then proceeds to connection point 142k where it will continue to decision block 144 of FIG. 4.

Referring again to FIG. 4 after the REVERSE BURST routine has been finished, program control proceeds to decision block 144. At this point the detect flag RCOPFG is checked to determine if it is equal to one. If the detect flag is equal to one, an allowed detect has occurred previously and program flow proceeds to the WAIT routine 129 as shown in FIG. 4 where the necessary delay between samples is established. If, however, the RCOPFG variable is not equal to one, this means that an allowed detect did not set the flag previously and program flow proceeds to decision block 146 shown in FIG. 4. At decision block 146 the variable HLONG is checked to determine if it is greater than or equal to seven. If the variable HLONG is greater than or equal to seven, then the detect is assumed to be a false detect resulting from a reverse burst tone on an adjacent tone channel. As a result, program flow will proceed to the INITIALIZE routine 120 as shown in FIG. 4.

However, if the variable HLONG is not greater than or equal to seven, then this indicates that the detection determined at block 138 was, in fact, a detection of the desired tone and as a result program flow proceeds to block 148 of FIG. 4. At this point the threshold variable GOOD is set equal to a hysteresis threshold THRESH2, which in the preferred embodiment is equal to 48. Thus, the threshold value is reduced from 91 to 48. In addition, the detect flag RCOPFG is set equal to one indicating a detect and this detection flag is output on the output port. Program flow then proceeds to the WAIT routine 129 where the necessary delay is established before the next sample is taken at block 122.

Figure 10:
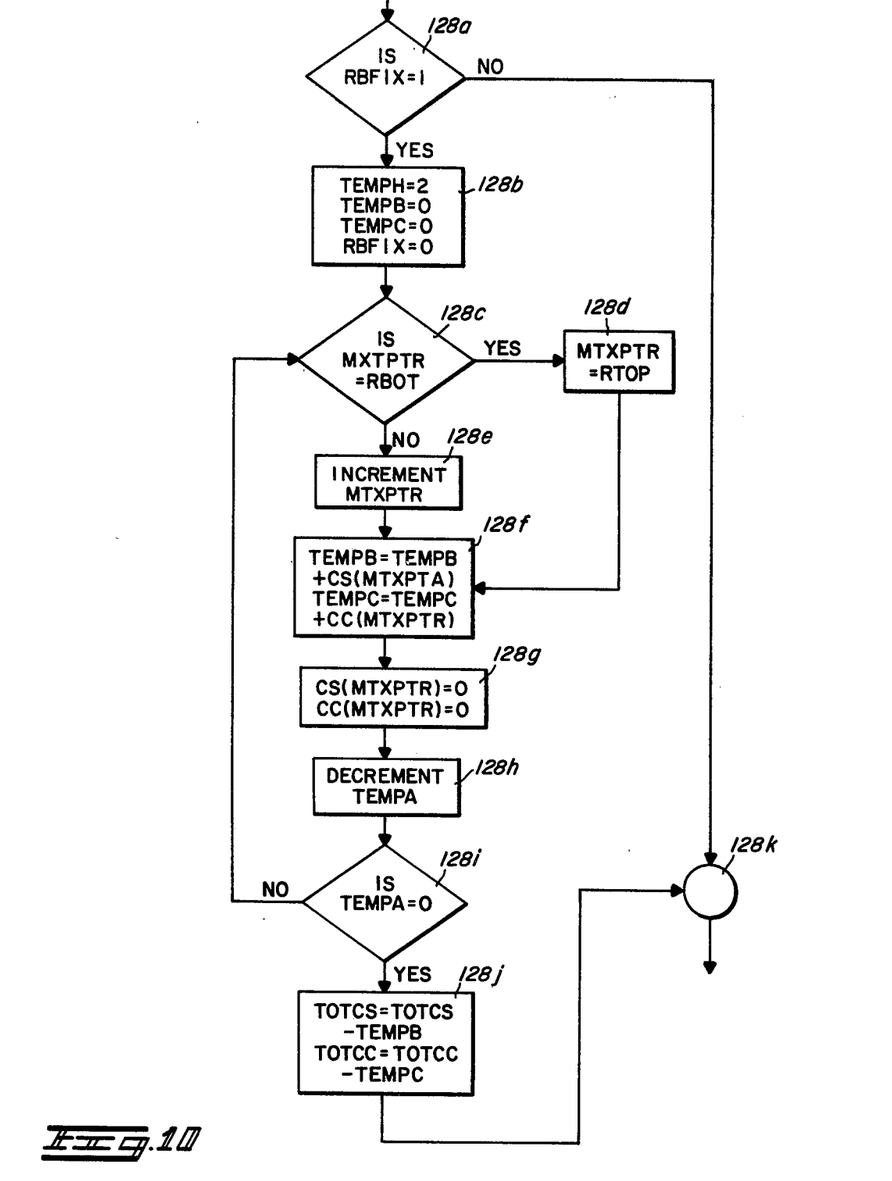
FIG. 10 is a program flow diagram for the REVERSE BURST CHECK routine of the computer program for the invention.

Referring back to block 126 of FIG. 4, if enough samples have not been taken to complete a subwindow, then program flow proceeds to the REVERSE BURST CHECK routine, block 128 as shown in FIG. 4. This REVERSE BURST CHECK routine 128 is indicated in greater detail in FIG. 10. Referring now to FIG. 10, it can be seen that the REVERSE BURST CHECK routine 128 is entered at decision block 128a. At block 128a it is determined whether the variable RBFIX is equal to one. If it is not equal to one, this means the processing of the REVERSE BURST CHECK routine is not necessary. Therefore, program flow proceeds to connection point 128k as shown. From this point program flow proceeds to the WAIT routine 129 shown in FIG. 4.

If, however, RBFIX is equal to one, this indicates that reverse burst processing of the data is required. Therefore, program flow proceeds to block 128b as shown in FIG. 10. At block 128b a temporary variable TEMPA is set equal to two, a temporary variable TEMPB is set to zero and a temporary variable TEMPC is set to zero. In addition, the variable RBFIX is cleared to zero. This is required since the processing of the REVERSE BURST CHECK routine is done only after the first sample of the new bottom subwindow just after the new bottom has been defined in block 142. Therefore, once this part of the routine has been entered, RBFIX must be set to equal zero so that it is not entered again until the variable RBFIX is reset to one by the REVERSE BURST routine 142. Program flow then proceeds from block 128b to decision block 128c. At this decision block the matrix pointer MTXPTR is checked to determine whether it is equal to RBOT, that is, to see whether the matrix pointer is pointing at the real bottom of the matrix. If the matrix pointer is at the real bottom of the matrix, then the matrix pointer MTXPTR is set equal to the top of the matrix TOPMTX as shown in block 128d. This is done because if the maxtrix pointer MTXPTR (which at this point has been set to the new bottom) is at the real bottom then the first subwindow to be cleared is the top location of the matrix. Program flow then proceeds to block 128f. However, if the matrix pointer is not equal to RBOT, the program flow proceeds to block 128e as shown where the matrix pointer MTXPTR is incremented so as to be pointing at the next subwindow. Program flow then proceeds to block 128f. At block 128f the variable TEMPB is set equal to the existing value of TEMPB plus the cosine correlation value of the sine correlation matrix CS for the subwindow of the present value of the matrix pointer MTXPTR. Also, at block 128f, the variable TEMPC is set equal to the existing value of TEMPC plus the cosine correlation value from the cosine correlation matrix CC at the subwindow of the present matrix pointer value. Program then proceeds to block 128g where the sine correlation and cosine correlation matrix values for the present subwindow are set equal to zero and program flow then proceeds to block 128h where the value of TEMPA is decremented. Program flow then proceeds to decision block 128i where it is determined whether the variable TEMPA is equal to zero. Since it was initially set to two, after the first time through the routine, the result of this decision will be NO and program flow will proceed back to block 128c where the previously described process will be repeated. After the second time through the routine, the value TEMPA will equal zero and program flow will proceed to block 128j where the total sine correlation value TOTCS will be set equal to the previously existing total sine correlation value TOTCS minus the value of TEMPB. Also the total cosine correlation value TOTCC will be set equal to the previously existing value TOTCC minus the value of TEMPC. The net result is that the correlation matrix is limited and the subwindows which are to be skipped are set to zero and removed from the total correlation values TOTCS and TOTCC. Program flow then proceeds out of the REVERSE BURST CHECK routine and to the WAIT routine 129 as shown in FIG. 4.

In summary, a digital pseudo continuous correlation tone detector suitable for use in a continuous tone control squelch system has been described, which system is particularly adaptable for implementation in a microcomputer system.

While a preferred embodiment of the invention has been described and shown, it should be understood that other variations and modifications may be implemented. It is therefore contemplated to cover by the present application any and all modifications and variations that fall within the true spirit and scope of the basic underlying principles disclosed and claimed herein.

What is claimed is:

1. A method of processing an input signal to detect at least one desired tone of a plurality of tones, comprising the steps of:

(a) digitizing the input signal to generate samples of the input signal at a predetermined rate;

(b) assigning each sample to a phase subregion of a reference waveform where the reference waveform has the frequency of the desired tone;

(c) summing the sample values for each phase subregion for sequential time intervals to obtain a phase subregion subtotal for each time interval;

(d) correlating, at the end of each time interval, for a number of the latest time intervals, the phase subregion subtotals against at least one local reference waveform so as to obtain a total correlation value for each local reference waveform, said total correlation value being a total summation of the products of the sum over a number of the latest time intervals of the subtotals of each phase subregion multiplied by the amplitude of a corresponding phase subregion of the local reference waveform;

(e) processing the total correlation values at the end of each time interval to obtain a sum of the absolute values of the total correlation values;

(f) comparing at the end of each time interval the sum of the absolute values of the total correlation values to a first threshold in generating a detection indication signal in response to said sum exceeding said first threshold.

2. The method of claim 1 wherein the comparing step further comprises the step of changing the first threshold to a second threshold in response to the generation of the detection indication signal; and changing from the second threshold to the first threshold in response to the absolute values of the total correlation values falling below the second threshold.

3. The method of claim 2 further comprising the steps of:

detecting undesired tones of frequencies near the desired tone on adjacent tone channels;

generating a background detection indication signal in response to detecting that an undesired tone is present;

generating an inhibit control signal, in response to the background detection indication signal, representative of the probability that an undesired tone has been present over a period of time prior to the sum of the absolute value of the total correlation value exceeding the first threshold;

inhibiting generation of the detection indication signal in response to the inhibit control signal.

4. The method of claims 2 or 3 further comprising the steps of:

comparing at the end of each time interval and in response to the detection indication signal the sum of the absolute values of the total correlation values to a third threshold and generating a reverse burst signal in response to the sum of the absolute values of the total correlation values exceeding said third threshold;

reducing the number of time intervals used in correlating in response to the reverse burst signal;

comparing at the end of each time interval in which the reduced number of time intervals is used, the sum of the absolute values of the total correlation values to a fourth threshold and generating a control signal in response to the sum of the absolute values of the total correlation values falling below the fourth threshold;

increasing the reduced number of time intervals used in correlating to the first predetermined number of time intervals in response to the control signal.

5. The method of claim 3 wherein the step of detecting further comprises the step of correlating at the end of each time interval for a predetermined number of the latest time intervals, the phase subregion subtotals against at least one local reference waveform so as to obtain at least one correlation value for each local reference;

processing the correlation values to obtain at least one correlation coefficient representative of the probability that the sampled input signal includes a tone with a frequency of the desired tone;

detecting the undesired tones based on the comparison between the correlation coefficients and a fifth threshold.

6. The method of claim 4 wherein the step of digitizing comprises hard limiting the input signal.

7. The method of claim 4 wherein the step of digitizing comprises analog to digital conversion.

8. The method of claim 4 further comprising the step of filtering the input signal.

* * * * *